(12) United States Patent
Martinez et al.

(10) Patent No.: US 6,184,585 B1
(45) Date of Patent: Feb. 6, 2001

(54) CO-PACKAGED MOS-GATED DEVICE AND CONTROL INTEGRATED CIRCUIT

(75) Inventors: Roberto Martinez, Plano, TX (US); Chuan Cheah, El Segundo, CA (US)

(73) Assignee: International Rectifier Corp., El Segundo, CA (US)

( * ) Notice: Under 35 U.S.C. 154(b), the term of this patent shall be extended for 0 days.

(21) Appl. No.: 09/191,951

(22) Filed: Nov. 13, 1998

Related U.S. Application Data

(60) Provisional application No. 60/065,397, filed on Nov. 13, 1997.

(51) Int. Cl.$^7$ .................................................... H01L 23/48
(52) U.S. Cl. ............................................. 257/777; 257/666
(58) Field of Search ................................ 257/666, 777, 257/676, 778, 723, 724, 686

(56) References Cited

U.S. PATENT DOCUMENTS

| | | | |
|---|---|---|---|
| 4,818,895 | * | 4/1989 | Kaufman . |
| 4,945,445 | * | 7/1990 | Schmerda et al. . |
| 5,008,736 | * | 4/1991 | Davies et al. . |
| 5,313,095 | * | 5/1994 | Tagawa et al. . |
| 5,798,538 | * | 8/1998 | Nadd et al. . |
| 5,894,165 | * | 4/1999 | Ma et al. . |
| 5,998,856 | * | 12/1999 | Noda et al. . |
| 6,057,598 | * | 5/2000 | Payne et al. . |
| 6,069,401 | * | 5/2000 | Nakamura et al. . |
| 6,072,243 | * | 6/2000 | Nakanishi . |
| 6,077,724 | * | 6/2000 | Chen . |
| 6,107,874 | * | 8/2000 | Ohashi . |

FOREIGN PATENT DOCUMENTS 1231361   9/1989   (JP) .

* cited by examiner

Primary Examiner—Sheila V. Clark
(74) Attorney, Agent, or Firm—Ostrolenk, Faber, Gerb & Soffen, LLP

(57) ABSTRACT

An electronic package for an electronic device includes a substrate. A power transistor die has a lower surface and an upper surface, and the lower surface of the power transistor die is mounted on the substrate. A control circuit for controlling the power transistor is mounted to the upper surface of the power transistor die using an insulating epoxy.

20 Claims, 9 Drawing Sheets

CO-PACKAGED MOS-GATED DEVICE AND CONTROL INTEGRATED CIRCUIT

RELATED APPLICATIONS

This application claims the priority of U.S. Provisional Application Ser. No. 60/065,397, filed Nov. 13, 1997.

BACKGROUND OF THE INVENTION

The present invention relates to a co-packaged field effect transistor (FET) and integrated circuit (IC) for a portable electronic device and, more particularly, to a co-packaged FET and IC such as for a switching power supply employing at least one FET, a Schottky diode, and an appropriate control circuit IC.

With reference to FIG. 1, it is known to use FET transistors in a forward switching power supply which, for example, is a buck power supply 10. The power supply 10 is coupled to a source of input DC power, Vin, having positive and negative terminals. An input filter capacitor 12 is coupled across the positive and negative terminals of Vin to provide a source of local energy storage.

First and second switching transistors Q1, Q2 are coupled in series across the positive and negative terminals of Vin. It is known that transistors Q1 and Q2 may be MOS gated FETs, each having a respective gate, drain, and source terminal. As is known in the art, a control IC 16 supplies gating signals to the gate terminals G1, G2 of transistors Q1 and Q2, respectively, to produce a pulse with modulated (PWM) signal at the junctions of transistors Q1, Q2.

A Schottky diode D1 is coupled in an anti-parallel configuration with transistor Q2 in order to provide a freewheeling current path in a shunt across the transistor, as is known in the art.

In order to provide a relatively steady and smooth supply of DC output power at Vo, a second order filter is provided which utilizes a series coupled inductor L and a shunt coupled capacitor 14, as is also known in the art. The second order filter attenuates substantially all of the high frequency components of the PWM signal to produce the DC output voltage across the positive and negative terminals of Vo.

A sensing resistor Rs is provided in series with the inductor L so that a voltage may be developed across the resistor which is indicative of the current flowing through the inductor L. The sensed voltage is input to the control IC 16 so that the switching transistors Q1, Q2 may be properly controlled, for example by current mode control. Further, a resistor divider is coupled from the positive terminal to the negative terminal of Vo and employs resistors R1 and R2. A sensed voltage is taken from the junction of resistors R1 and R2 and is input to the control IC 16. The sensed voltage provides information as to the voltage level at Vo and is also used by the control IC 16 to properly bias transistors Q1 and Q2, for example by voltage mode control.

Because the switching frequency of transistors Q1 and Q2 may be relatively high and the current levels flowing through the transistors may also be relatively high, packaging considerations become critical. For example, transistors Q1 and Q2, as well as diode D1, may operate at elevated temperatures due to the high switching frequencies and high current conditions. Further, the lengths of the interconnections between the transistors Q1 and Q2, the control IC 16, and diode D1 may produce undesired stray inductances which cause excessive noise, excessive heat dissipation and spurious circuit operation.

Additionally, when the switching power supply 10 is incorporated into an electronic device which, for example, is a portable electronic device, the portion of the total circuit board area that is allocated to the power supply 10 becomes critical. Typically, power components such as transistors Q1, Q2 and diode D1 have relatively large footprints. TO-220 packages are often used to house transistors Q1 and Q2, which are relatively large and have a relatively low silicon to footprint ratio (about 15%).

Consequently, the designers of portable electronic devices are under ever increasing pressure to reduce the amount of area and/or volume utilized by the power supply 10.

Accordingly, a novel package for encapsulating power components and control circuitry to reduce the size and weight of the package, as well as to improve the circuit performance, by minimizing the parasitic inductances is needed in the art.

SUMMARY OF THE INVENTION

To overcome the disadvantages of the prior art, the present invention provides an electronic package for a portable electronic device which includes a power transistor die which has a lower surface and an upper surface, with the lower surface of the power transistor die mounted on the substrate, and a control circuit which controls the power transistor and is mounted to the upper surface of the power transistor die using an insulating epoxy.

In accordance with the invention, a semiconductor device includes a conductive lead frame having one or more pad areas. A first semiconductor die includes an MOS-gated semiconductor device which has opposing surfaces. A first opposing surface has at least one electrode that is disposed in electrical contact with the main pad area. A second one of the opposing surfaces has at least a gate electrode. A second semiconductor die includes a control IC with a first opposing surface that is disposed in contact with, but is electrically isolated from, the second opposing surface of the MOS-gated device. A second opposing surface of the control IC has at least one electrode that is electrically coupled to the gate electrode of the MOS-gated semiconductor device.

Other features and advantages of the present invention will become apparent from the following description of the invention which refers to the accompanying drawings.

BRIEF DESCRIPTION OF THE DRAWINGS

For the purpose of illustrating the invention, there is shown in the drawing a form which is presently preferred, it being understood, however, that the invention is not limited to the precise arrangement and instrumentality shown.

DETAILED DESCRIPTION OF THE INVENTION

Figure 2:
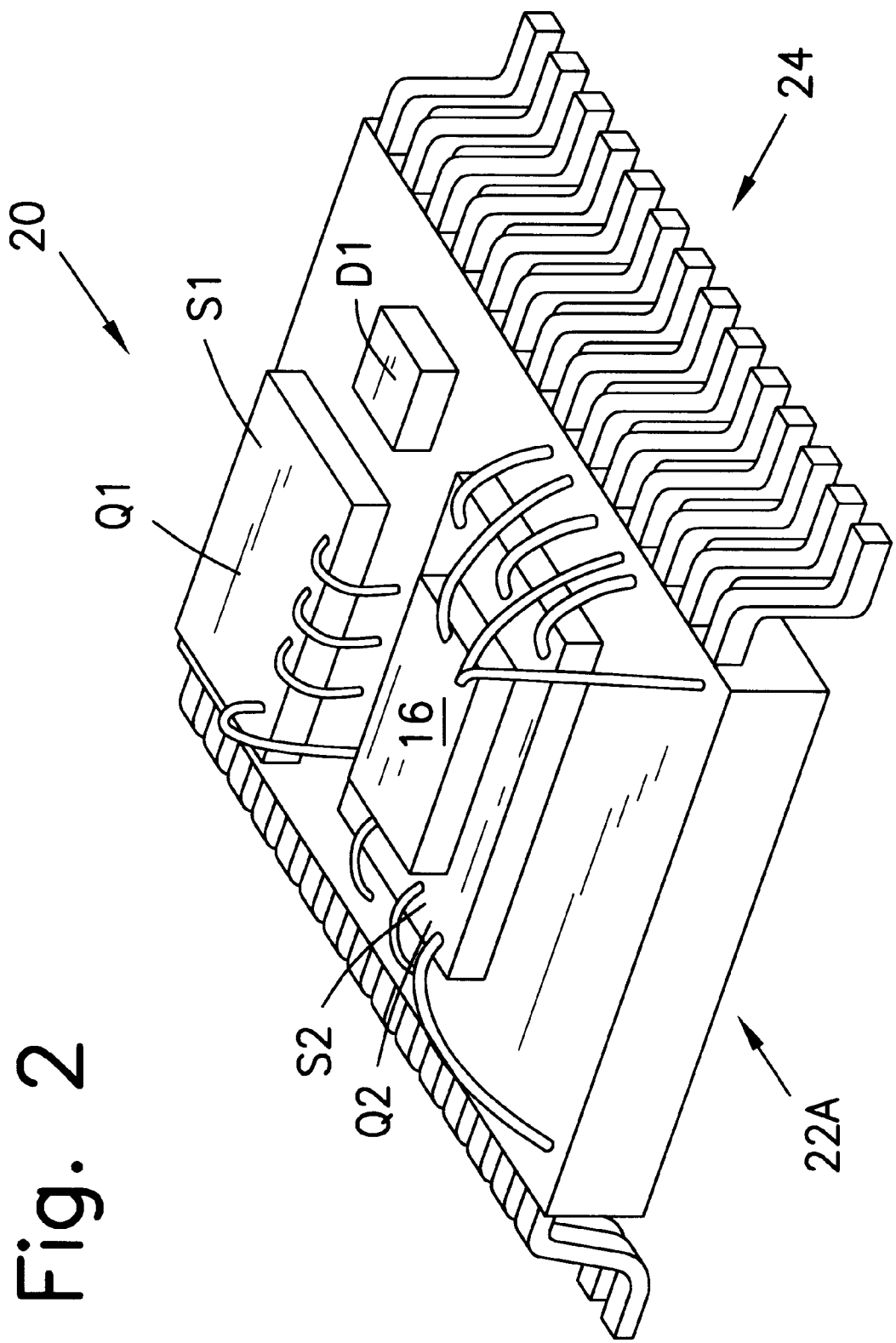
FIG. 2 shows a perspective view of the bottom portion of a package in accordance with the present invention.

Referring now to the drawings wherein like numerals indicate like elements, FIG. 2 shows a perspective view of a package 20 in accordance with the present invention. For clarity, the package 20 as shown in FIG. 2 does not include a cover which would normally encapsulate the electronic components of the package 20. Rather, FIG. 2 shows only a lower portion 22A having a lead frame, substrate, and patternable interconnections (not separately shown) on which the electronic components of the present invention are mounted.

Particularly, the package 20 includes a first transistor Q1, a second transistor Q2, which may be MOSFETs or other MOS-gated power devices, a control IC 16, and a diode D1, which is preferably a Schottky diode. Transistors Q1 and Q2 are coupled to the substrate using known techniques, for example, by connection epoxy and/or solder. The diode D1 may also be coupled to the substrate in the same manner.

Preferably, each of the transistors Q1 and Q2 is a MOSFET having an upper surface, preferably including a source connection S1, S2 and a lower surface, preferably including a drain connection D1, D2.

The control IC 16 is mounted to the upper surface of transistor Q2 using a suitable interconnecting medium. It is preferred that the interconnecting medium is an insulating epoxy which may be obtained from known sources. It is further preferred that the insulating epoxy have the properties of electrical isolation but provide thermal conductivity between the control IC 16 and the transistor Q2.

Figure 3:
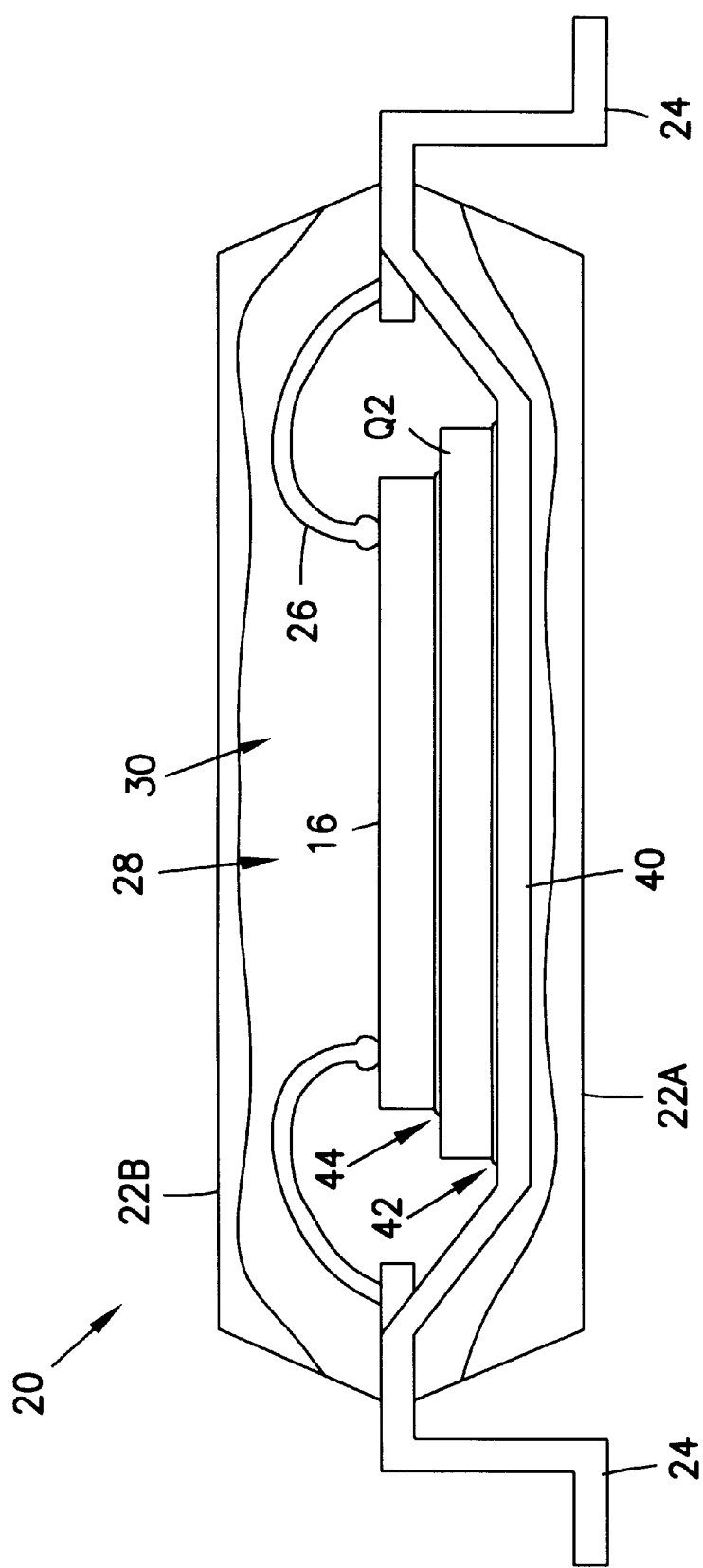
FIG. 3 shows a cut-away side elevational view of the package of FIG. 2.

FIG. 3 shows a cut-away side elevational view of the package 20 of FIG. 2. The package 20 includes a lower portion 22a and an upper portion 22B forming an enclosure having an interior space 28. Terminals 24 interconnect the circuitry within the package to external circuitry and enter the interior space 28 and form part of a lead frame 40. The lower surface of the transistor Q2 is generally electrically coupled to a pad area of the lead frame 40 at interface 42 using, for example, a conductive epoxy. The integrated circuit 16, however, is coupled to the upper surface of the transistor Q2 at interface 44 using an insulation epoxy. Bond wires 26 couple the control circuit IC 16 to the terminals 24 as required.

Preferably, the interior space 28 of the package 20 is substantially filled with a thermally conducting filler 30, such as AlNi. The filler 30 ensures that heat is carried from the electronic components of the package to the upper and lower portions 22a, 22b and terminals 24 of the package 20, thereby improving the thermal performance of the package 20.

Preferably, the upper surface of transistor Q2 include a source connection S2 upon which an aluminum layer is disposed. Thus, the upper surface of transistor Q2 provides a heatsink for the control IC 16.

Figure 4:
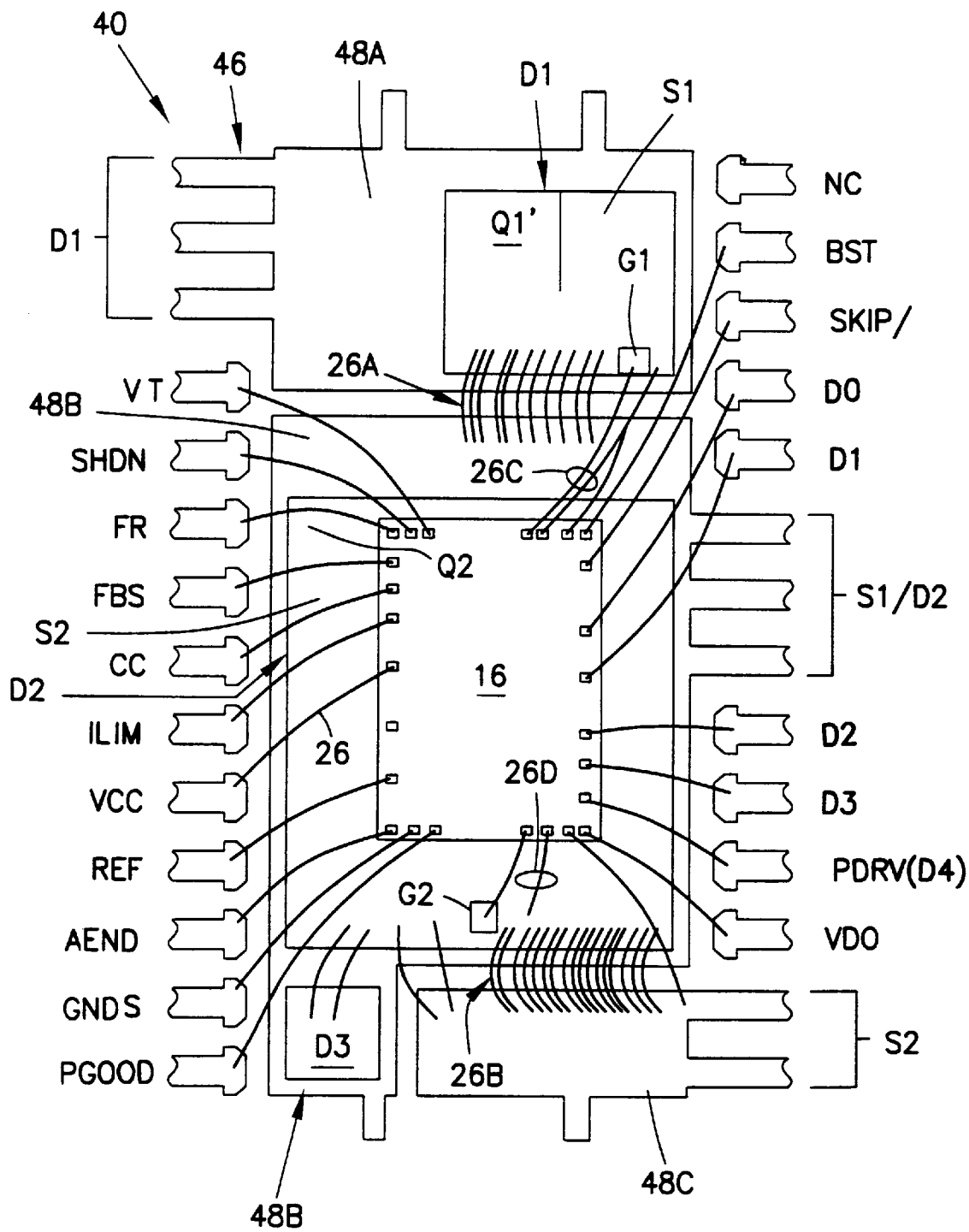
FIG. 4 shows a top view of a lead frame in accordance with an embodiment of the present invention.

FIG. 4 shows an arrangement of the lead frame 40 and the electronic components mounted thereto in accordance with an embodiment of the present invention. The lead frame 40 includes three independent pad or receiving areas 48A, 48B, and 48C. The independent pad areas 48A, 48B, and 48C provide power connections between the electronic components and the external electronic device as well as a receiving area on which the electronic components are mounted.

The lead frame 40 includes external connection leads or pins 46 which are each coupled to at least one of the pads 48A, 48B, 48C. Some of the connection leads 46 are integral with one of the pads 48A, 48B, 48C such as, for example, the leads D1, S1/D2, and S2. Other leads 46 are electrically connected to the pads 48A, 48B, 48C or to the connection points on the control IC 16, transistors Q1, Q2, or diode D1 by way of one or more of the bonding wires 26. Interconnections between pads 48A, 48B, 48C may also be made by using one or more of the bond wires 26.

A first pad 48A of the lead frame 40 is adapted to receive the lower surface of transistor Q1, which is bonded to pad 48A using known methods, with conductive epoxy preferred. It is also preferred that the lower surface of transistor Q1 include the drain D1 connection and, therefore, the leads integral with the receiving area 48A are labeled D1.

Pad 48B is adapted to receive transistor Q2 thereon. As with transistor Q1, it is preferred that the lower surface of transistor Q2 include a drain terminal D2 that is suitably bonded to pad 48B using a suitable method. Leads S1/D2 are directly coupled to receiving pad 48B. The receiving pad 48B also receives the Schottky diode D3 having a cathode terminal conductivity bonded to the pad area 48B and an anode terminal connected by bonding wires to source terminal 52 of transistor Q2.

Pad 48C provides a connection to source S2 of transistor Q2 via plural wire bonds 26B.

Advantageously, pads 48A, 48B and 48C are sized and shaped such that transistors Q1 and Q2 and diode D3 are in close proximity to one another to facilitate ease of interconnection and to minimize the length of the interconnects. For example, the source S1 of transistor Q1 is coupled to the drain D2 of transistor Q2 by multiple bond wires 26A which are relatively short. The interconnection between the source S2 of transistor Q2 and pad 48C use multiple bond wires 26B which are also relatively short. Consequently, any stray inductance that is introduced in the circuit is minimized, and the operation of the circuit is thus improved.

Further, bond wires 26C connects between control circuit IC 16 and the gate electrode G1 and the source electrode S1 of transistor Q1, which forms a gate-source loop, and are also very short to reduce parasitic inductance in the gate-source loop and permit fast turn on and turn off of transistor Q1. Likewise, the interconnections between the control IC 16 to gate terminal G2 and source terminal S2 of the transistor Q2, which form a gate source loop, are made by bond wires 26D and are very short to reducing stray inductance.

In a preferred configuration, the size of the silicon die are as follows: 1) transistor Q1 is approximately 140×80 mils, 2) transistor Q2 is approximately 140×169 mils, 3) control IC 16 is approximately 80×120 mils, and 4) diode D1 is approximately 36×36 mils. As is apparent to one skilled in the art in view of the above teaching, the surface area of the control IC 16 can be no larger than the surface area of transistor Q2.

The advantages of the package 20 of the present invention are as follows:

1. the footprint area of the package 20 is significantly reduced;
2. the ratio of silicon area to footprint area of the package 20 is greater than about 50% (and may be about 75%);
3. the total footprint area of the package 20 is reduced by about 47% as compared to conventional packaging;
4. the three independent pads 48A, 48B, and 48C provide all receiving areas needed for the electronic components as well as power connections to the drain terminal D1, the S1/D2 connection, and the source terminal S2;

5. the schottky diode D3 may be located in an otherwise unusable location;
6. the substantially short gate-source loops reduce the parasitic inductance and increase the switching performance as well as facilitate kelvin connections to the gate and source of transistors Q1 and Q2;
7. the electrical characteristics between transistor Q2 and control circuit IC 16 are matched; and
8. the overall package weight is reduced.

Figure 1:
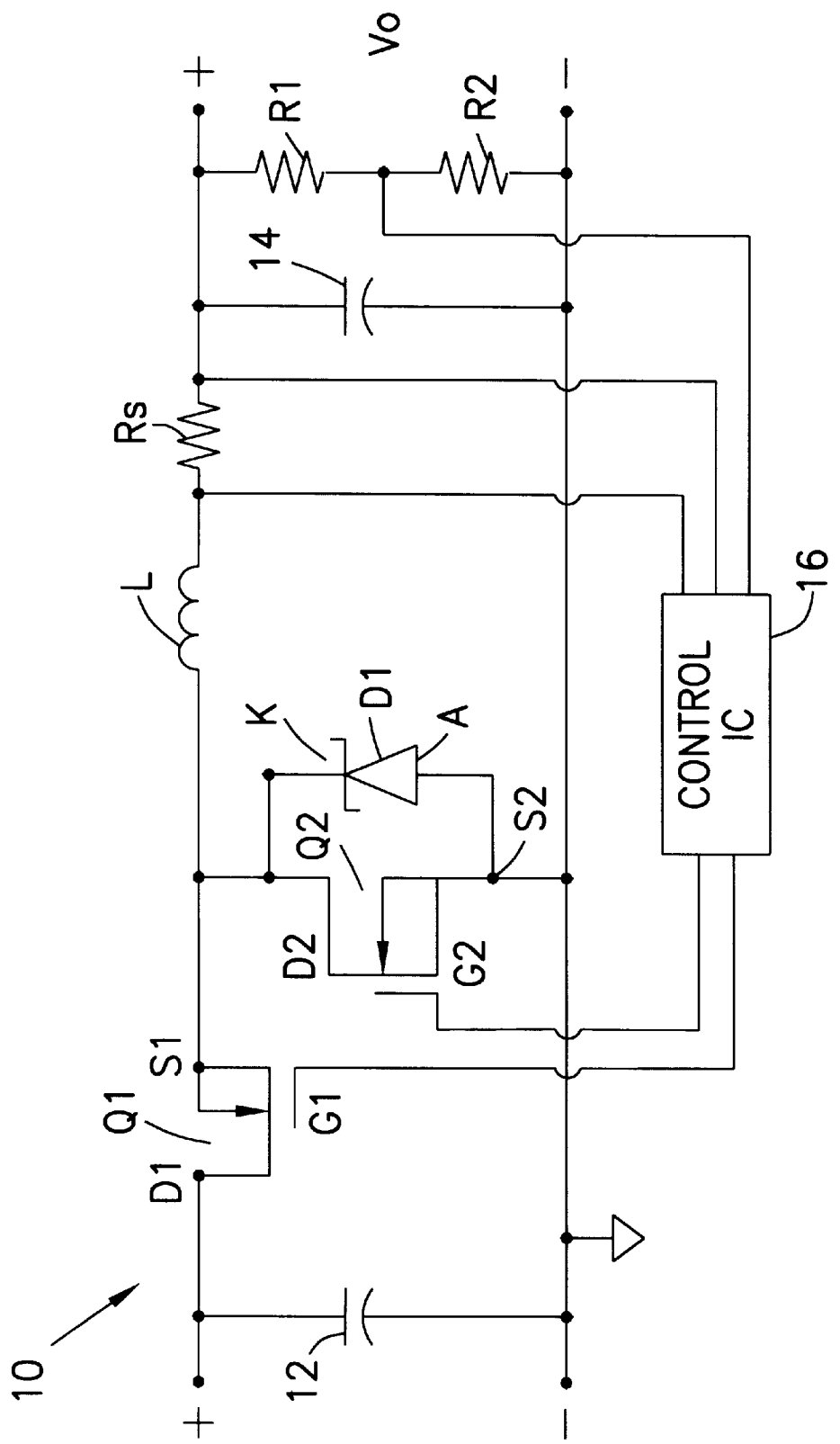
FIG. 1 is a schematic diagram showing a known switching power supply circuit.

The package 20 may includes all of the switching power supply circuit 10 shown in FIG. 1. The power supply 10 produces an output voltage from between about 1.2 volts to 2.0 volts, with 1.6 volts being nominal, at about 7 amps with an input voltage of approximately 5 to 24 volts.

Figure 5:
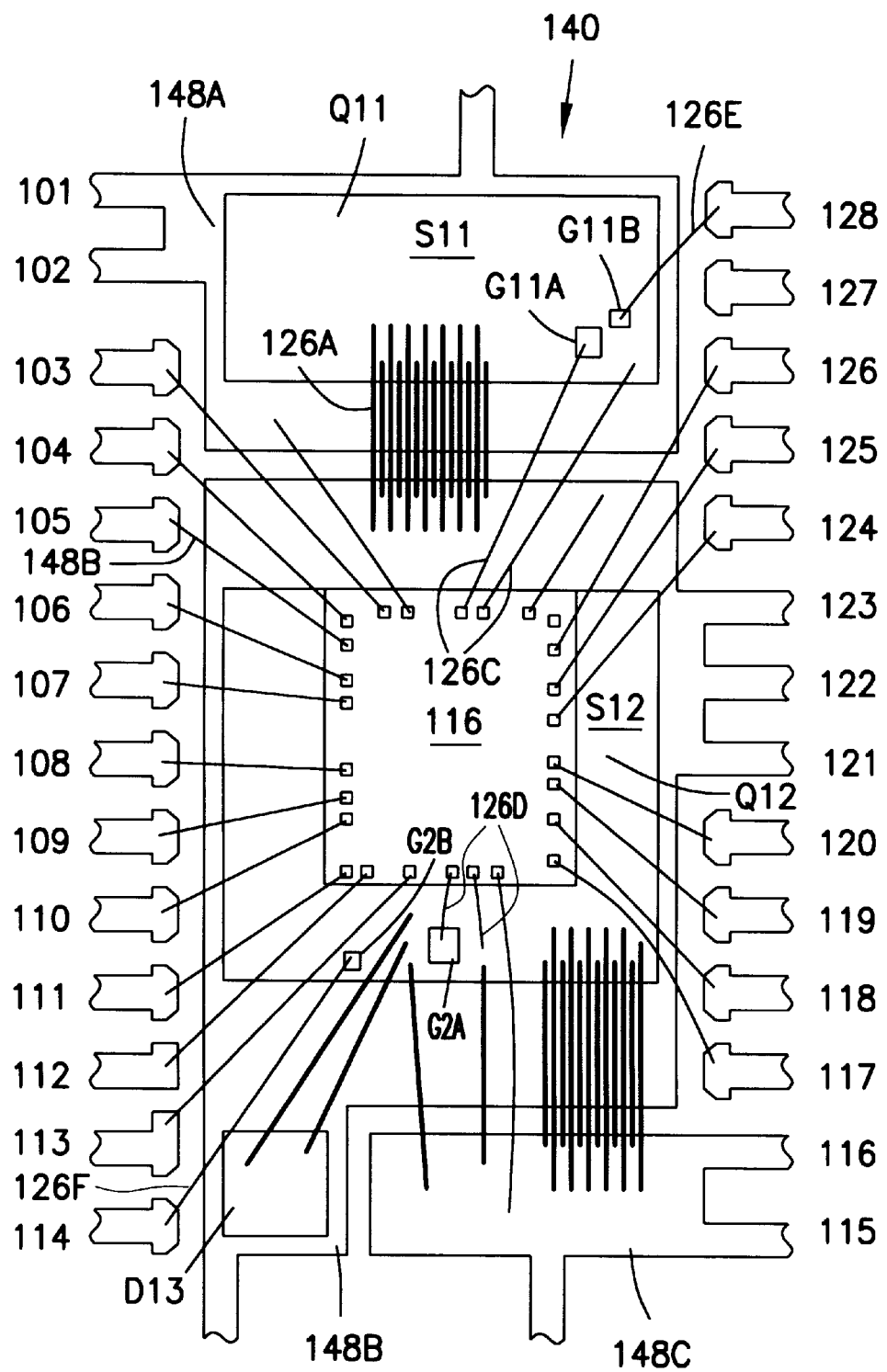
FIG. 5 shows a top view of a lead frame in accordance with another embodiment of the invention.

FIG. 5 shows another embodiment of the invention. Here, a lead frame 140 includes three independent pads 148A, 148B and 148C which provide connections in the same manner described above regarding the embodiment of FIG. 4. The lead frame 140 also includes connection leads 146 which also provide connections in the manner described above.

Here, however, transistors Q11 and Q12 are provided in place of transistors Q1 and Q2 of FIG. 4 and are each controlled by dual gates. Transistor Q11 is provided with an internally controlled gate G11A that is connected by bond wires 126C to control IC 116 in a manner similar to that of FIG. 4. Transistor Q11 is also provided with an externally connected gate G11B which is connected by wire 126E to external pin 128. Similarly, transistor Q12 is provided with an internally connected gate G12A which is connected by wire bond 126D to the control IC 116, and transistor Q12 is also provided with an externally connected gate G12B which is connected by lead 126F to external pin 114.

Additionally, the source S11 of transistor Q11 is connected by multiple bond wires 126A to pad area 148B to which the drain of transistor Q12 is connected. The drain of transistor Q11 is connected to pad area 148A from which integral pins 101 and 102 provide an external connection. The drain of transistor Q12 is provided with an external connection through pins 121, 122 and 123, and the source S12 of transistor Q12 is connected by multiple bond wires 126B to pad area 148C and by a bond wire to control IC 116.

A Schottky diode D13 is connected in anti-parallel configuration with transistor Q12 by multiple bonding wires that connect to the source S12 of transistor Q12 and by direct connection to pad area 14B.

As in the embodiment of FIG. 4, the pad areas 148A, 148B and 148C are sized and shaped such that the transistors Q11 and Q12 and the diode D13 are in close proximity to one another to provide ease of interconnection and minimize the lengths of the connections between the components.

Figure 6:
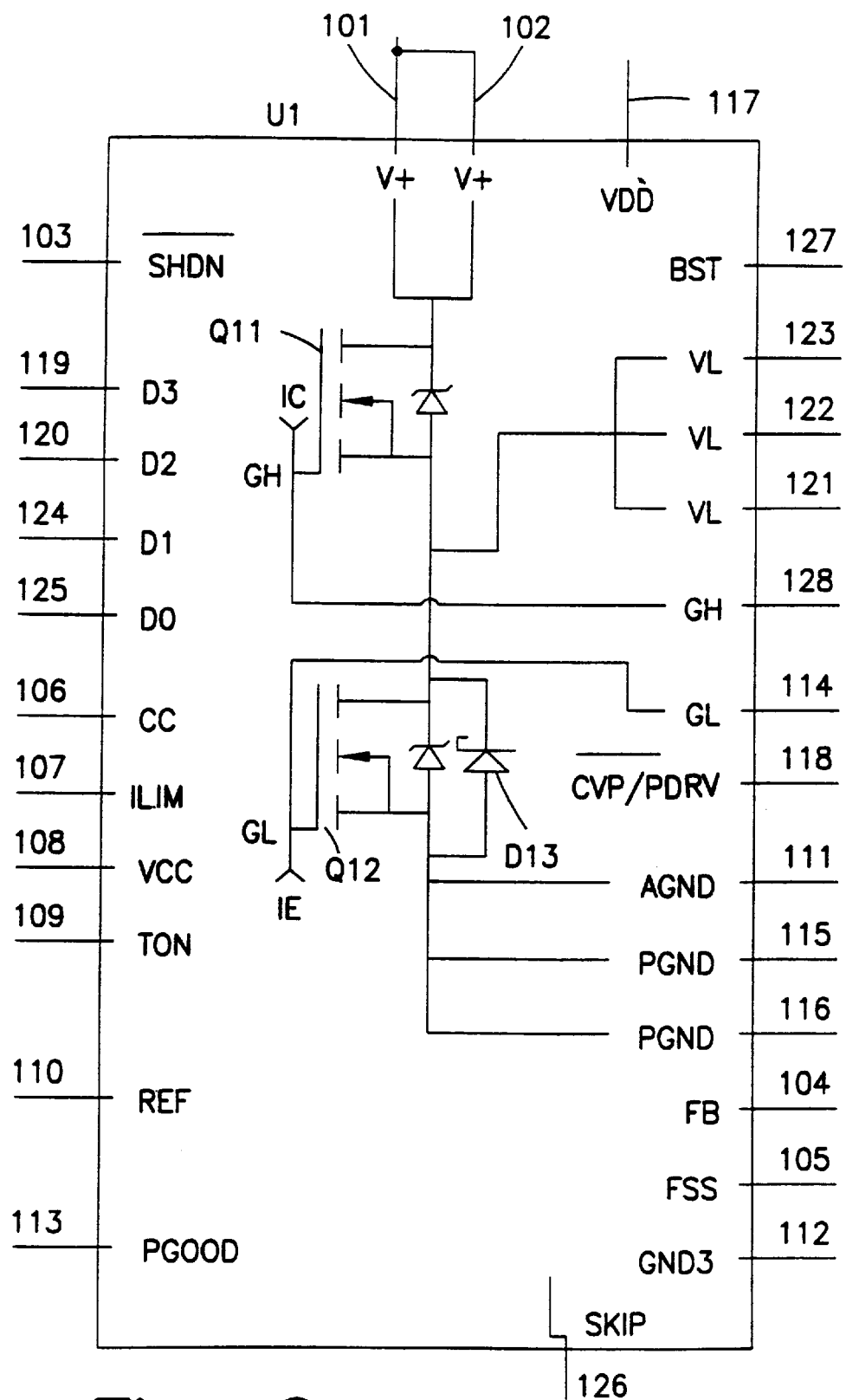
FIG. 6 is a schematic diagram showing a portion of the interconnections of the lead frame of FIG. 5.

A schematic diagram showing the connections between transistors Q11 and Q12 and diode D13 as well as their external connections are shown in FIG. 6. It should be noted that the gates of transistors Q11 and Q12 are connected to external pins 128 and 114, respectively, as well as by internal connections to the control IC. Additionally, the pins whose connections are not shown are each connected to a respective terminal of the control IC 116.

It is noted that transistor Q1 or Q11 may be eliminated from the package 40 or 140 and implemented using a discrete transistor, such as in a TO-220 package, for improved thermal performance.

Figure 7:
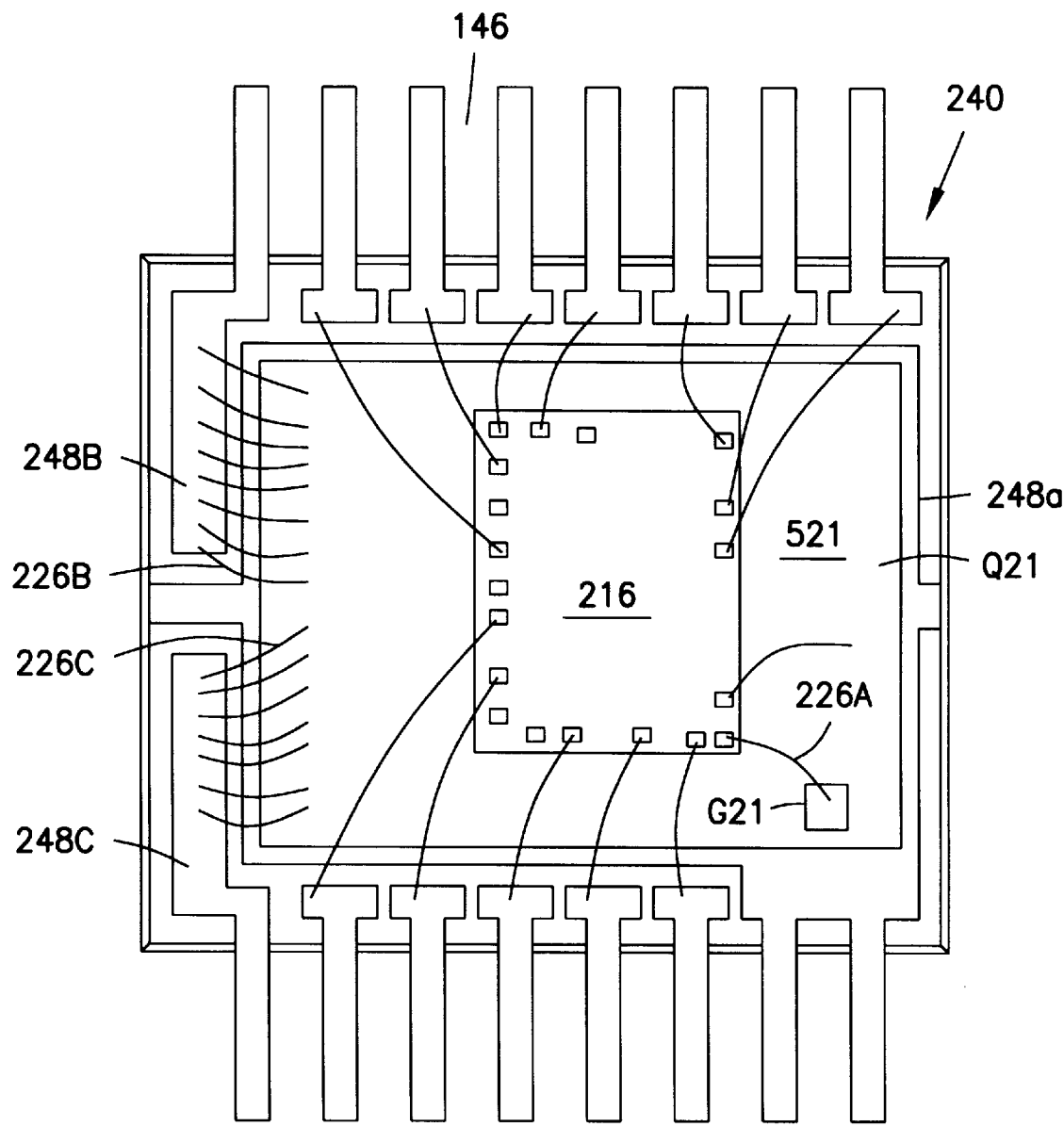
FIG. 7 shows a top view of a lead frame in accordance with a further embodiment of the invention.

As an example, FIG. 7 shows a single transistor Q21 mounted on pad area 248A in a package 240 with a control IC 216 mounted atop transistor Q21. Here, the control IC 216 is connected to gate G21 of transistor Q21 via lead wire 226A. Source S21 of transistor Q21 is connected by multiple bond wires 226B and 226C to pad areas 248B and 248C, respectively, which have integral external pins. The drain of transistor Q21 is connected to pad area 248A which also has two integral external pins. Bonding wires are also provided to connect respective pad areas of control IC 216 to other isolated external pins.

Again, the pad areas 248A, 248B and 248C are configured to minimize the length of the connections to the control IC and transistor.

Figure 8:
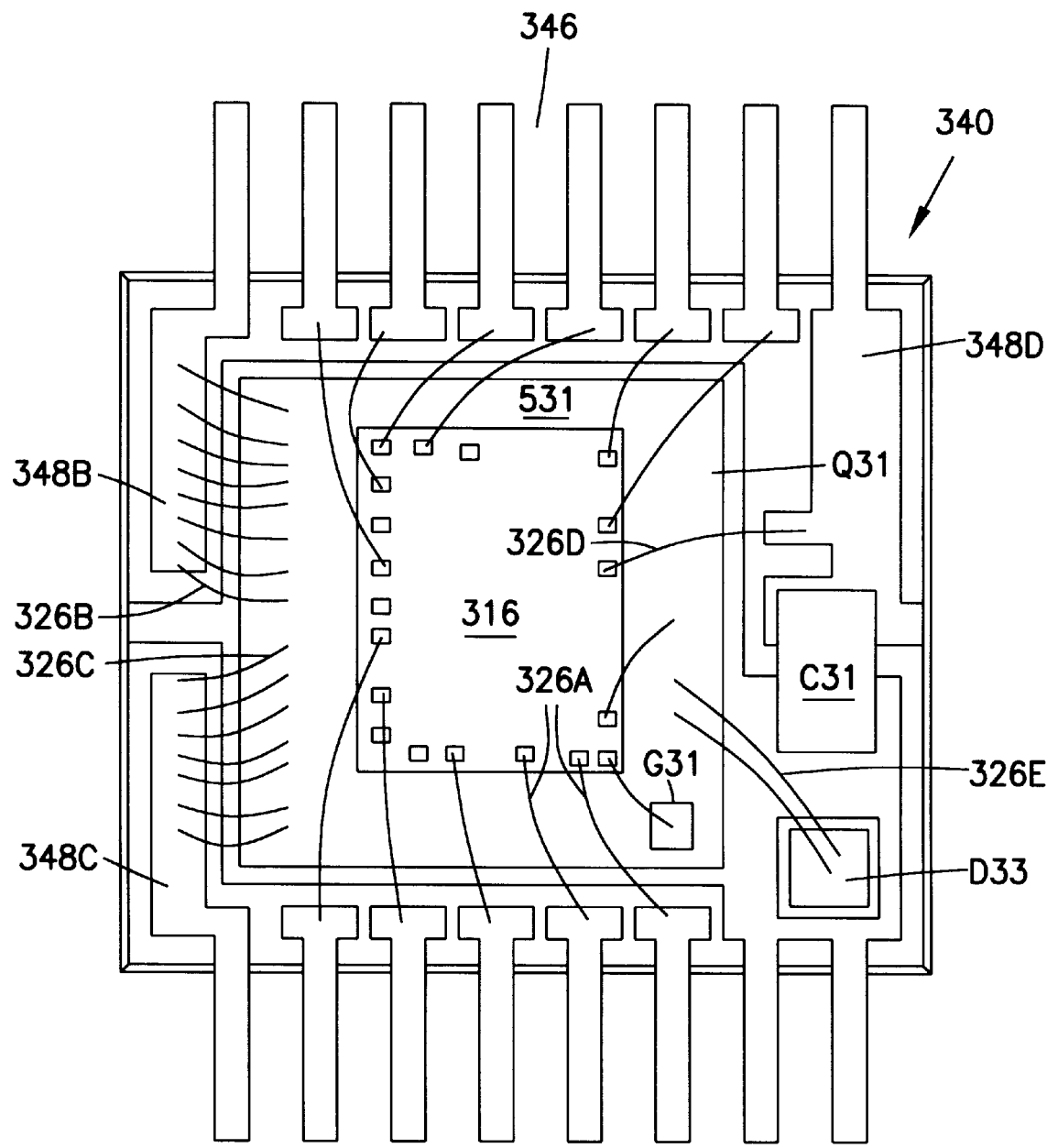
FIG. 8 shows a top view of a lead frame in accordance with a still further embodiment of the invention.

FIG. 8 shows yet another embodiment of the invention in which a control IC 316 is mounted atop a transistor Q31 and are provided with interconnections and external connection similar to those shown in FIG. 7. In this embodiment, however, a diode D31 is also provided on pad 348A whose bottom surface includes a cathode terminal that is electrically connected to the pad area and whose top surface includes an anode terminal that is connected by bond wires to source S31 of transistor Q31. Further, a fourth pad area 348D is provided which is connected by bonding wire 326D to a terminal of control IC 316. A shunt capacitive element C31 is also provided atop pad areas 348A and 348D and connects the two pad areas.

Figure 9:
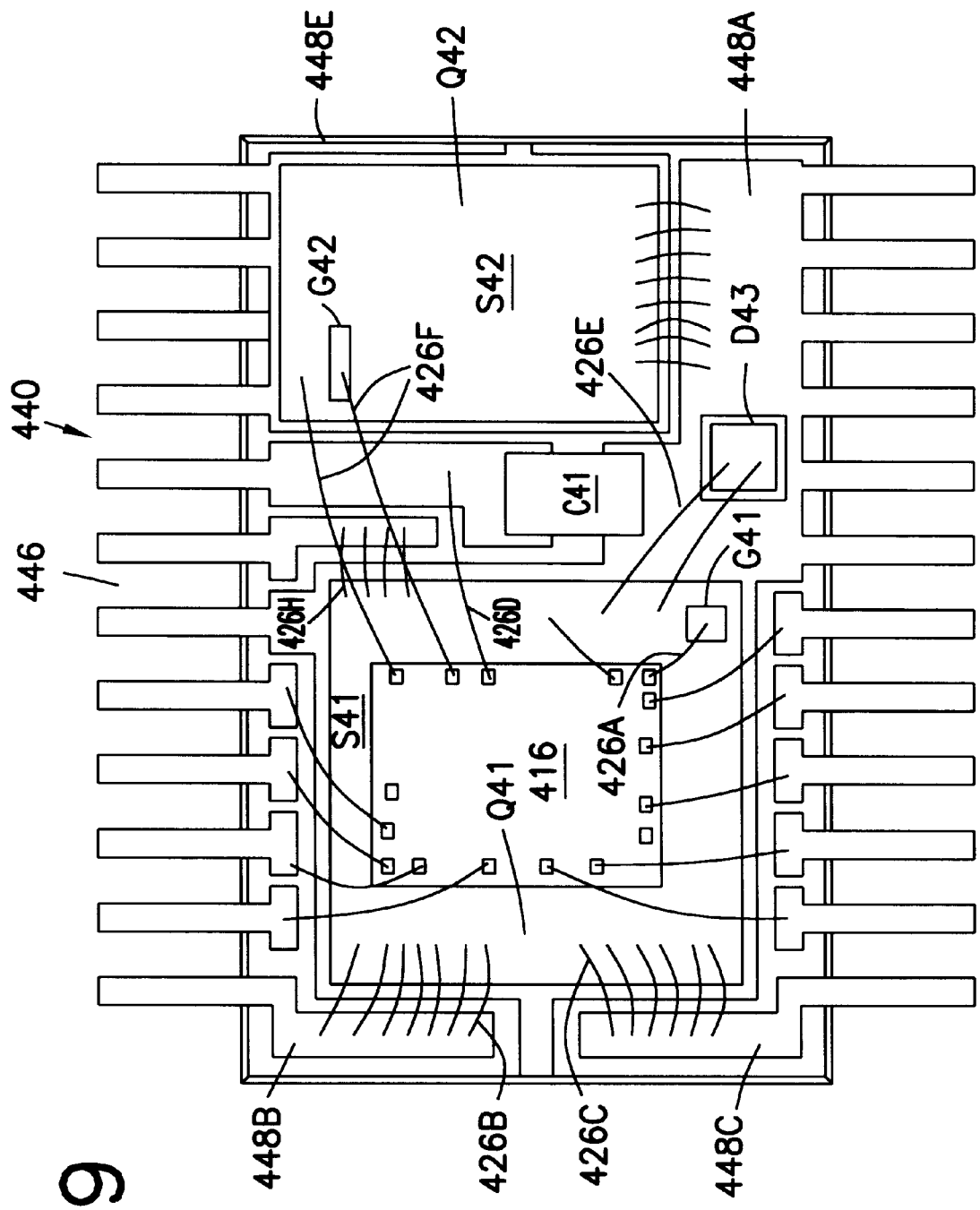
FIG. 9 shows a top view of a lead frame in accordance with yet another embodiment of the invention.

FIG. 9 shows a further embodiment of the invention which includes the pad areas 448A, 448B, 448C, 448D, control IC 416, transistor Q41, diode D41 and capacitive element C41 and their interconnects 426A, 426B, 426C, 426D, 426E which are similar to those shown in FIG. 8. Additionally, a fifth bonding pad area 448E is provided upon which a second transistor Q42 is mounted having a gate G42 and source S42 which are connected to respective bonding pads on control IC 416 by bond wires 426F. Source S42 is also connected by multiple wires 426G to pad 448A and thereby connected to the drain of transistor Q41 and to diode D41. A further pad area 448F is provided which provides a further external connection for source S41 via bonding wires 426H.

The foregoing description of the preferred embodiment of the present invention has been provided for the purposes of illustration and description it is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A semiconductor device comprising:
   a conductive lead frame having at least one pad area;
   a first semiconductor die comprising an MOS-gated semiconductor device having opposing surfaces, a first one of said opposing surfaces having at least one electrode being disposed in electrical contact with said one pad area, a second one of said opposing surfaces having at least a gate electrode; and
   a second semiconductor die comprising a control IC having opposing surfaces, a first one of said opposing surfaces of said control IC being disposed in contact with but electrically insulated from said second opposing surface of said MOS-gated device, a second one of said opposing surfaces of said control IC having at least one electrode that is electrically coupled to said gate electrode of said MOS-gated semiconductor device.

2. The device of claim 1 wherein said first surface of said MOS-gated device includes a drain terminal and said second surface of said MOS-gated device includes a source terminal.

3. The device of claim 1 wherein said one pad area includes at least one integral pin.

4. The device of claim 1 wherein said lead frame further comprises a plurality of isolated pins, and said control IC includes a plurality of terminals that are each electrically connected to a respective one of said external pins.

5. The device of claim 2 wherein said one pad area includes at least one integral pin that provides an external connection to said drain terminal.

6. The device of claim 1 wherein said lead frame includes a second pad area.

7. The device of claim 6 further comprising another MOS-gated device having a first opposing surface that is mounted on said second pad area and a second opposing surface that includes a gate terminal that is electrically connected to said control IC.

8. The device of claim 7 wherein said second surface of said another MOS-gated device includes a source terminal that is electrically connected to said one pad area.

9. The device of claim 1 wherein said second opposing surface of said MOS-gated device includes a further gate electrode that is electrically connected to an external isolated pin.

10. The device of claim 7 wherein said second opposing surface of said another MOS-gated device includes a further gate terminal that is electrically connected to an external isolated pin.

11. The device of claim 1 further comprising a diode that is mounted on said one pad area and is connected in anti-parallel arrangement with said MOS-gated device.

12. The device of claim 2 further comprising at least one further pad area that includes at least one integral external pin and which is electrically connected to said source terminal of said MOS-gated device.

13. The device of claim 1 further comprising a further pad area having at least one external pin, and wherein said device further includes a capacitive element that is electrically coupled to said one pad area and said further pad area.

14. A semiconductor device comprising:
a conductive lead frame having at least first and second pad areas;
a first semiconductor die comprising a first MOS-gated semiconductor device having opposing surfaces, a first one of said opposing surfaces having at least one electrode being disposed in contact with said first pad area, a second one of said opposing surfaces having at least a gate electrode and another electrode;
a second semiconductor die comprising a control IC having opposing surfaces, a first one of said opposing surfaces of said control IC being disposed in contact with but electrically insulated from said second opposing surface of said first MOS-gated device, a second one of said opposing surfaces of said control IC having at least one electrode that is electrically coupled to said gate electrode of said first MOS-gated semiconductor device;
a third semiconductor die comprising a diode having opposing surfaces, a first one of said opposing surfaces of said diode being disposed in electrical contact with said first main pad area, a second one of said opposing surfaces having at least one electrode that is electrically coupled with said another electrode of said first MOS-gated semiconductor device; and
a fourth semiconductor die comprising an MOS-gated semiconductor device having opposing surfaces, a first one of said opposing surfaces of said second MOS-gated semiconductor device having at least one electrode being disposed in electrical contact with said second pad area, a second one of said opposing surfaces having at least a gate electrode and another electrode, said gate electrode of said second MOS-gated semiconductor device being electrically coupled to said control IC, and said another electrode of said second MOS-gated semiconductor device being electrically coupled to said first pad area.

15. The device of claim 14 wherein said first surface of said first MOS-gated device includes a drain terminal and said another electrode of said second surface of said first MOS-gated device comprises a source terminal.

16. The device of claim 14 wherein said first surface of said second MOS-gated device includes a drain terminal and said another electrode of said second surface of said second MOS-gated device comprises a source terminal.

17. The device of claim 14 wherein said first surface of said diode includes a cathode and said second surface of said diode includes an anode.

18. The device of claim 14 wherein said lead frame includes a third pad area that is electrically connected to said another electrode of said first MOS-gated semiconductor device.

19. The device of claim 14 wherein said second surface of said MOS-gated device includes a further gated electrode that is electrically connected to an external isolated pin.

20. The device of claim 14 wherein said second opposing surface of said second MOS-gated device includes a further gate terminal that is electrically connected to an external isolated pin.

* * * * *